(12) United States Patent
Choi et al.

(10) Patent No.: US 8,748,233 B2
(45) Date of Patent: Jun. 10, 2014

(54) INTEGRATED CIRCUIT PACKAGING SYSTEM WITH UNDERFILL AND METHOD OF MANUFACTURE THEREOF

(75) Inventors: DaeSik Choi, Seoul (KR); Oh Han Kim, Ichon-si (KR); Jung Sell, Seoul (KR)

(73) Assignee: Stats Chippac Ltd., Singapore (SG)

( * ) Notice: Subject to any disclaimer, the term of this patent is extended or adjusted under 35 U.S.C. 154(b) by 141 days.

(21) Appl. No.: 13/165,658

(22) Filed: Jun. 21, 2011

(65) Prior Publication Data

US 2012/0326291 A1 Dec. 27, 2012

(51) Int. Cl.
*H01L 21/44* (2006.01)

(52) U.S. Cl.
USPC ........... 438/119; 438/124; 438/126; 438/127; 438/112

(58) Field of Classification Search
USPC .......................... 438/119, 112, 124, 126, 127
See application file for complete search history.

(56) References Cited

U.S. PATENT DOCUMENTS

| | | |
|---|---|---|
| 5,977,626 A | 11/1999 | Wang et al. |
| 6,187,613 B1 | 2/2001 | Wu et al. |
| 6,191,360 B1 | 2/2001 | Tao et al. |
| 6,459,144 B1 | 10/2002 | Pu et al. |
| 6,486,562 B1 | 11/2002 | Kato |
| 6,538,319 B2 | 3/2003 | Terui |
| 7,061,103 B2 | 6/2006 | Chen et al. |
| 7,608,915 B2 | 10/2009 | Liao et al. |
| 2004/0212970 A1* | 10/2004 | Chen et al. .................... 361/764 |

FOREIGN PATENT DOCUMENTS

KR 20090081038 A 7/2009

* cited by examiner

*Primary Examiner* — Long Pham
(74) *Attorney, Agent, or Firm* — Ishimaru & Associates LLP

(57) ABSTRACT

A method of manufacture of an integrated circuit packaging system includes: providing a substrate; attaching a flip chip to the substrate; attaching a heat slug to the substrate and the flip chip; and forming a moldable underfill having a top underfill surface on the substrate, the flip chip, and the heat slug, the moldable underfill having a characteristic of being liquid at room temperature and the top underfill surface over the flip chip.

5 Claims, 4 Drawing Sheets

INTEGRATED CIRCUIT PACKAGING SYSTEM WITH UNDERFILL AND METHOD OF MANUFACTURE THEREOF

TECHNICAL FIELD

The present invention relates generally to an integrated circuit packaging system, and more particularly to a system for the integrated circuit packaging system having an underfill.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, and increase performance of the integrated circuit devices in an ever-increasing range of products such as cell phones, music players, televisions, and automobiles.

Packages of components such as semiconductor circuits, transistors, diodes, and other electronic devices must also become smaller and thinner with more functions and connections. In packaging components, the need for connecting packages with ever smaller connections influences robustness of the connections.

However, mass-production of integrated circuits is hampered by the high cost of the equipment necessary for a standard molding process. High temperatures and pressures not only increase the amount of equipment necessary, they also increase the chance of damage to internal components, reducing yield.

Thus, a need still remains for an integrated circuit packaging system that lowers the total cost of manufacture. In view of the increasing costs of raw materials, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; attaching a flip chip to the substrate; attaching a heat slug to the substrate and the flip chip; and forming a moldable underfill having a top underfill surface on the substrate, the flip chip, and the heat slug, the moldable underfill having a characteristic of being liquid at room temperature and the top underfill surface over the flip chip.

The present invention provides an integrated circuit packaging system, including: a substrate; a flip chip attached to the substrate; a heat slug having a top slug surface attached to the substrate and the flip chip, the top slug surface having an unblemished surface; and a moldable underfill having a top underfill surface on the substrate, the flip chip, and the heat slug, the top underfill surface over the flip chip.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
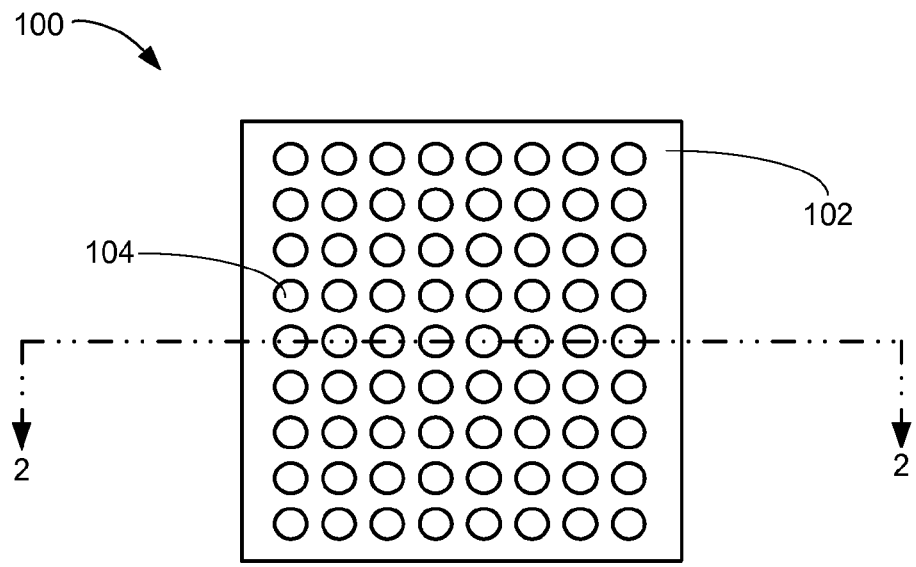
FIG. 1 is a bottom view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the active side of the flip chip, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in an embodiment of the present invention. The integrated circuit packaging system 100 is shown having a substrate 102 and an external interconnect 104. The substrate 102 is defined as a structure containing conductive traces and contacts. For example, the substrate 102 can be a laminate substrate, a ceramic substrate, a silicon substrate, or some other laminated structure for redistribution of signals. The external interconnect 104 can be attached to the substrate 102.

The external interconnect 104 is defined as an interface connector for connecting an integrated circuit package to a next level system (not shown). For example, the external interconnect 104 can be a solder ball, a solder bump, a stud bump, a conductive pillar, or other conductive structure.

Figure 2:
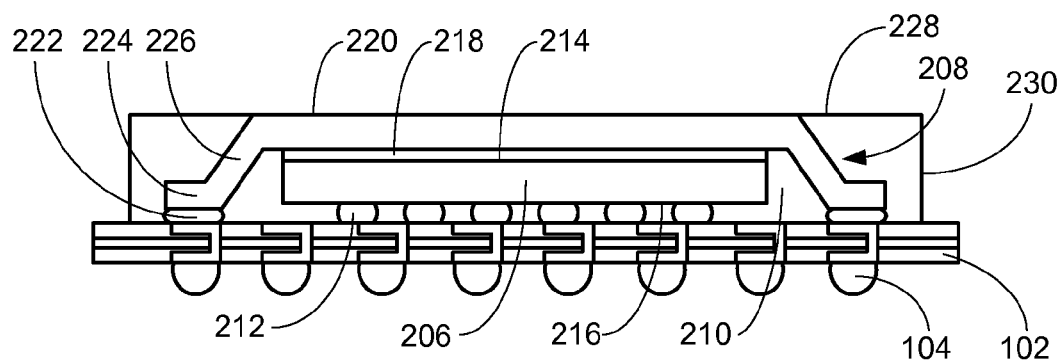
FIG. 2 is a cross-sectional view of the integrated circuit packaging system along the section line 2-2 of FIG. 1.

Referring now to FIG. 2, therein is shown a cross-sectional view of the integrated circuit packaging system 100 along the section line 2-2 of FIG. 1. The integrated circuit packaging system is shown having a flip chip 206, a heat slug 208, a moldable underfill 210, the substrate 102, and the external interconnect 104, as an example.

The flip chip 206 can be mounted on the substrate 102 and connected to the substrate 102 through an internal interconnect 212. The flip chip 206 can have a top chip surface 214. The top chip surface 214 is defined as the non-active surface of the flip chip 206. The flip chip 206 can have an active side 216 opposite the top chip surface 214. The active side 216 is defined as the side of the flip chip 206 having active circuitry fabricated thereon.

The internal interconnect 212 is defined as an electrical connector for connecting an integrated circuit to other components within a package. For example, the internal interconnect 212 can be a solder ball, a metallic bump, or a conductive column. The internal interconnect 212 can be on and between the flip chip 206 and the substrate 102. In this example, the internal interconnect 212 can also support the flip chip 206 over the substrate 102.

The top chip surface 214 can be completely covered by a thermal interface material 218. The thermal interface material 218 is defined as a thermally conductive substance, which fills a region between components. For example, the thermal interface material 218 can be a thermal paste, a thermal gel, a thermal grease, or a phase-change material such as a tape that flows under heat. The thermal interface material 218 can be on and between the flip chip 206 and the heat slug 208.

The heat slug 208 is defined as a thermal dissipation structure for an integrated circuit. For example, the heat slug 208 can be made from metal, metal alloy, or ceramic. The heat slug 208 can have a top slug surface 220. The top slug surface 220 can be the planar surface of the heat slug 208 opposite the thermal interface material 218. The top slug surface 220 can be characterized by having an unblemished surface as a result of using softer materials to seal the top slug surface 220 from the application of the moldable underfill 210.

The heat slug 208 can be attached to the flip chip 206 with the thermal interface material 218. The heat slug 208 can be attached to the substrate 102 with a conductive adhesive 222. The conductive adhesive 222 is defined as an electrically and thermally conductive material that connects components. The conductive adhesive 222 can be on and between the heat slug 208 and the substrate 102.

The heat slug 208 can have a heat slug leg 224 and a heat slug foot 226. For example, the heat slug foot 226 can be the portion of the heat slug 208, which contacts the conductive adhesive 222. The heat slug foot 226 can be connected to the top slug surface 220 by the heat slug leg 224. The heat slug leg 224 can be at an obtuse angle to the top slug surface 220 and the heat slug leg 224.

The moldable underfill 210 is defined as a material which is liquid at room temperature and curable by heat to form a solid. Room temperature is defined as the usual ambient temperature indoors, and can range from 15 degrees Celsius to 30 degrees Celsius. The moldable underfill 210 can have a top underfill surface 228 and a non-horizontal underfill surface 230. The moldable underfill 210 can be on and can enclose the flip chip 206, the internal interconnect 212, and a portion of the heat slug 208. The top slug surface 220 can be exposed from the moldable underfill 210.

The top underfill surface 228 can be the surface of the moldable underfill 210 opposite the surface of the moldable underfill 210 that touches the substrate 102. The top underfill surface 228 can be planar and can be coplanar with the top slug surface 220. The top underfill surface 228 can cover an area smaller than the area of the substrate 102. The top underfill surface 228 can be over the flip chip 206.

The non-horizontal underfill surface 230 can be the non-horizontal side of the moldable underfill 210. The non-horizontal underfill surface 230 can extend from the top underfill surface 228 to the substrate 102. For example, the non-horizontal underfill surface 230 can be planar and perpendicular to the top underfill surface 228 and the substrate 102.

It has been discovered that using the moldable underfill 210 instead of an epoxy molding compound can improve reliability and yield in manufacturing. For example, because the moldable underfill 210 is liquid at room temperature before curing, the moldable underfill 210 can be molded on the flip chip 206 and the heat slug 208 at lower temperatures and pressures as compared to the high heat and pressure required to inject an epoxy molding compound (not shown). The lower temperatures and pressures required can decrease the chance that there will be delamination between the flip chip 206 and the substrate 102 or between the heat slug 208 and the flip chip 206 because there will be less stress put on the internal interconnect 212 during the assembly process, for example.

It has also been discovered that using the moldable underfill 210 to cover all the components in the integrated circuit packaging system 100 in a single step rather than using an underfill to protect the plurality of the internal interconnects 212 followed by an encapsulation step can reduce manufacturing cost. For example, the moldable underfill 210 can be stored as a liquid ready for use as compared to an epoxy molding compound which requires processing such as melting and mixing before the epoxy molding compound will be ready for use. Removing an epoxy molding compound from the manufacturing process by using only the moldable underfill 210 can greatly reduce complicated and expensive processing equipment. In addition, supply costs can be decreased because only the moldable underfill 210 can be required to protect the integrated circuit packaging system 100 rather than the underfill and the epoxy molding compound.

It has been further discovered that using the moldable underfill 210 instead of an epoxy molding compound can allow the use of different materials to create the substrate 102. For example, the substrate 102 can be a flexible substrate that would fail under standard manufacturing techniques because the moldable underfill 210 can be injected at lower temperatures and pressures. Also for example, the substrate 102 can be made of materials which are less rigid than usual because there is less of a concern about warpage of the substrate 102 during encapsulation. The use of more flexible materials in the substrate 102 can lead to lower costs and greater ease of manufacture because of lower material costs and fewer storage issues.

Figure 3:
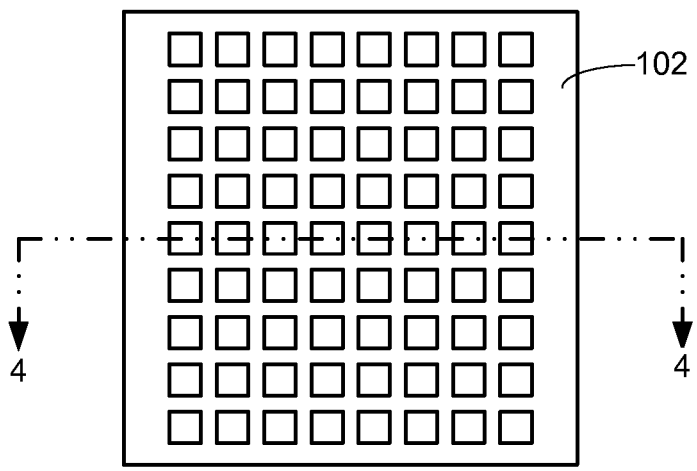
FIG. 3 is a bottom view of the substrate in a manufacturing step of the integrated circuit packaging system.

Referring now to FIG. 3, therein is shown a bottom view of the substrate 102 in a manufacturing step of the integrated circuit packaging system 100 of FIG. 1. The substrate 102 is shown with contacts for later attachment of the external interconnect 104 of FIG. 1.

For illustrative purposes, the substrate 102 is shown with the contacts in a regular, fully populated matrix pattern, although it is understood that the substrate 102 can be different. For example, the substrate 102 can have the contacts in a non-fully populated matrix pattern, only along the perimeter of the substrate 102, or randomly distributed.

Figure 4:
FIG. 4 is a cross-sectional view of the substrate along the section line 4-4 of FIG. 3.

Referring now to FIG. 4, therein is shown a cross-sectional view of the substrate 102 along the section line 4-4 of FIG. 3. The substrate 102 is shown with contacts and traces.

Figure 5:
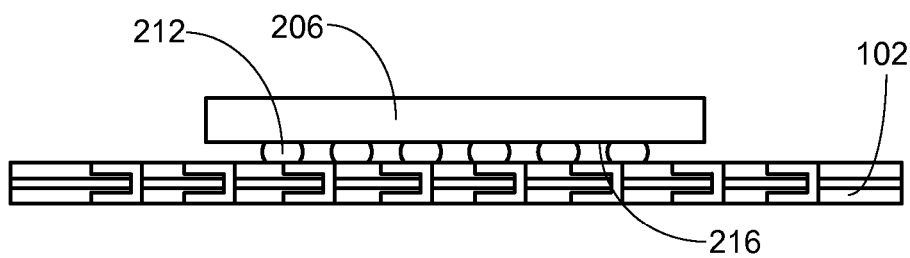
FIG. 5 is the structure of FIG. 4 in a manufacturing step of mounting the flip chip on the substrate.

Referring now to FIG. 5, therein is shown the structure of FIG. 4 in a manufacturing step of mounting the flip chip 206 on the substrate 102. The flip chip 206 is shown attached to the substrate 102 with the internal interconnects 212. The internal interconnects 212 can be on and between the active side 216 of the flip chip 206 and the substrate 102.

Figure 6:
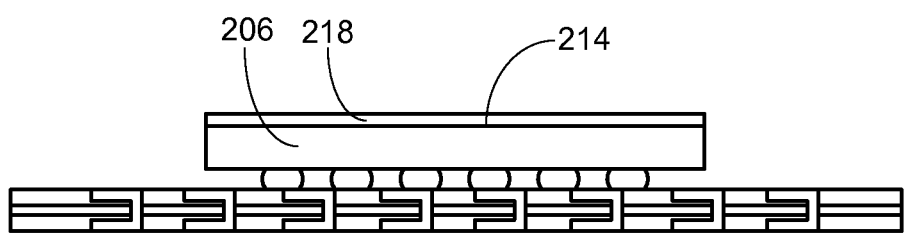
FIG. 6 is the structure of FIG. 5 in a manufacturing step of applying the thermal interface material on the flip chip.

Referring now to FIG. 6, therein is shown the structure of FIG. 5 in a manufacturing step of applying the thermal interface material 218 on the flip chip 206. The thermal interface material 218 is shown applied to the top chip surface 214 of the flip chip 206. The thermal interface material 218 can fully cover the top chip surface 214 of the flip chip 206.

For illustrative purposes, the thermal interface material 218 is shown fully covering the top chip surface 214 though it is understood that the thermal interface material 218 does not have to fully cover the top chip surface 214. For example, the thermal interface material 218 can be a thermal paste applied in a thin layer partially covering the top chip surface 214.

Figure 7:
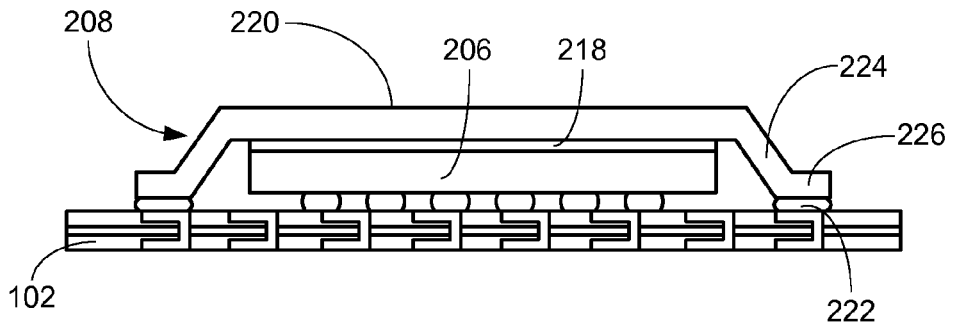
FIG. 7 is the structure of FIG. 6 in a manufacturing step of attaching the heat slug to the substrate and the flip chip.

Referring now to FIG. 7, therein is shown the structure of FIG. 6 in a manufacturing step of attaching the heat slug 208 to the substrate 102 and the flip chip 206. The heat slug 208 is shown on the thermal interface material 218 and attached to the substrate 102 with the conductive adhesive 222.

The conductive adhesive 222 can be on the heat slug foot 226 to attach the heat slug 208 to the substrate 102. The heat slug leg 224 can extend at an angle from the heat slug foot 226 to the top slug surface 220.

Figure 8:
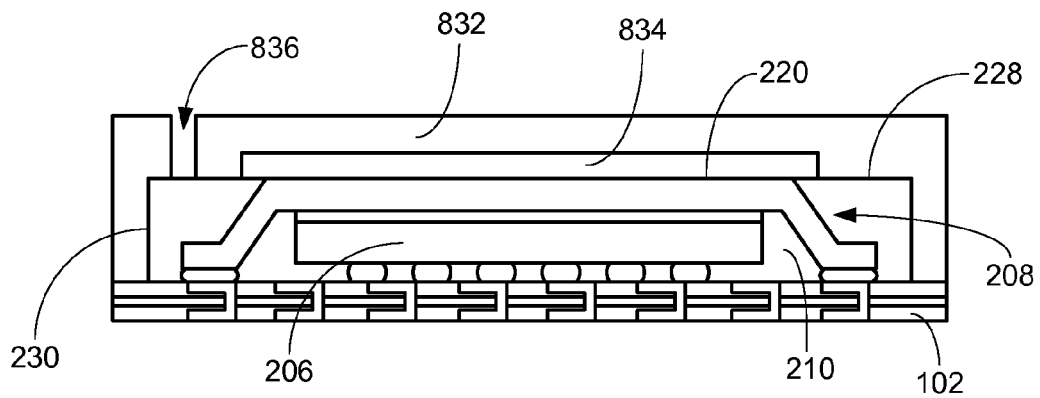
FIG. 8 is the structure of FIG. 7 in a manufacturing step of forming the moldable underfill on the heat slug, the substrate, and the flip chip.

Referring now to FIG. 8, therein is shown the structure of FIG. 7 in a manufacturing step of forming the moldable underfill 210 on the heat slug 208, the substrate 102, and the flip chip 206. The moldable underfill 210 is shown after injection into a mold chase 832 having a rubber insert 834 through a mold gate 836 in the top of the mold chase 832 but before removal of the mold chase 832.

The mold chase 832 can shape the moldable underfill 210. For example, the inner surface of the mold chase 832 can shape the non-horizontal underfill surface 230 and the top underfill surface 228. The rubber insert 834 can be inset in the top of the mold chase 832 and exposed on the inside of the mold chase 832. The moldable underfill 210 can be a liquid at room temperature, and as a result, the moldable underfill 210 can be injected into the mold chase 832 at a low temperature such as room temperature and low pressure such as atmospheric pressure.

As a result of the low temperature and low pressure requirements, the mold chase 832 can be made from many different materials. For example, the mold chase 832 can be made from metal, plastic, plastic with an inner metal lining, a thin metal structure with a non-stick coating, or other rigid, formable material to which the moldable underfill 210 does not stick. The moldable underfill 210 can be cured by heating to solidify the moldable underfill 210. After curing, the mold chase 832 can be removed.

The top underfill surface 228 can be characterized by the physical characteristics of the mold chase 832. Depending on what material is used to for the inner surface of the mold chase 832, after curing the moldable underfill 210 to solidify the moldable underfill 210, the moldable underfill 210 can have microscopic imperfections which mirror the inner surface of the mold chase 832. The mold chase 832 can leave an imprint or texture on the moldable underfill 210. For example, if the inner surface of the mold chase 832 is coated with a smooth, non-stick coating, the top underfill surface 228 and the non-horizontal underfill surface 230 can be smooth. Also for example, if the inner surface of the mold chase 832 is made from a metal, the moldable underfill 210 can take the texture of the finish of the metal such as slight scratches if the mold chase 832 was machined from a piece of metal.

The mold chase 832 with the rubber insert 834 can be positioned on the substrate 102 and the heat slug 208 so that the rubber insert 834 can fully cover the top slug surface 220. The rubber insert 834 can function to seal the top slug surface 220 and prevent any of the moldable underfill 210 from touching the top slug surface 220.

The use of the rubber insert 834 to seal the top slug surface 220 rather than just the mold chase 832 can leave the top slug surface 220 with an unblemished surface because the rubber insert 834 is softer than the heat slug 208 and will not leave scratches or dents in the top slug surface 220. The rubber insert 834 can seal the top slug surface 220 better than the mold chase 832 alone, and can leave the top slug surface 220 entirely free of the moldable underfill 210.

The application of the moldable underfill 210 after the attachment of the heat slug 208, which is attached to the substrate 102, can provide the integrated circuit packaging system 100 with better heat dissipation properties because heat can be dissipated through the substrate 102 as well as from the top slug surface 220.

For illustrative purposes, the mold chase 832 is described as having the rubber insert 834 though it is understood that the mold chase 832 may be used without the rubber insert 834. For example, the inner surface of the mold chase 832 can be planar, with no indentation for the rubber insert 834.

Figure 9:
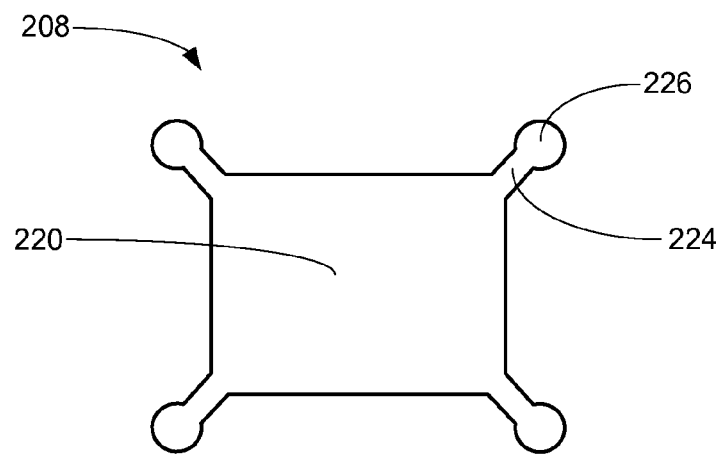
FIG. 9 is a top view of the heat slug.

Referring now to FIG. 9, therein is shown a top view of the heat slug 208. The heat slug 208 is shown unattached to other components for exemplary purposes. The heat slug 208 can have the top slug surface 220, the heat slug leg 224, and the heat slug foot 226.

The heat slug leg 224 can extend from the top slug surface 220 at an angle to the top slug surface 220. The heat slug foot 226 can be at the end of the heat slug leg 224 facing away from the top slug surface 220. The heat slug foot 226 can be circular in shape.

There can be four instances of the heat slug leg 224 and the heat slug foot 226, extending from the corners of the top slug surface 220. In this example, the top slug surface 220 is square.

For illustrative purposes, the heat slug 208 is described with the top slug surface 220 as a square though it is understood that the top slug surface 220 can be other shapes. For example, the top slug surface can be a rectangle, a trapezoid, an octagon, or other shape that covers the thermal interface material 218 on the top chip surface 214.

Figure 10:
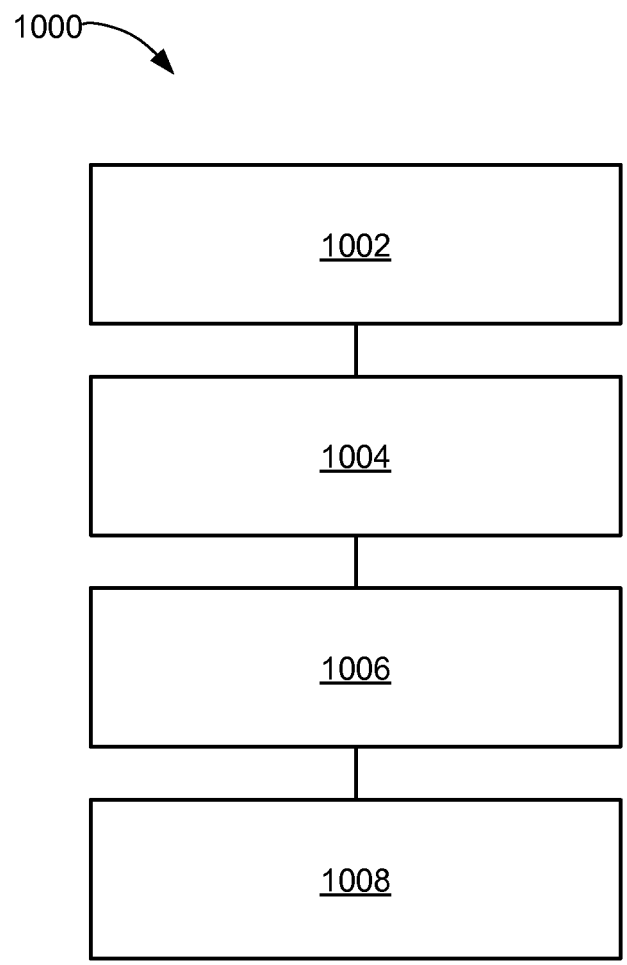
FIG. 10 is a flow chart of a method of manufacture of an integrated circuit packaging system in a further embodiment of the present invention.

Referring now to FIG. 10, therein is shown a flow chart of a method 1000 of manufacture of an integrated circuit packaging system in a further embodiment of the present invention. The method 1000 includes: providing a substrate in a block 1002; attaching a flip chip to the substrate in a block 1004; attaching a heat slug to the substrate and the flip chip in a block 1006; and forming a moldable underfill having a top underfill surface on the substrate, the flip chip, and the heat slug, the moldable underfill having a characteristic of being a liquid at room temperature and the top underfill surface over the flip chip in a block 1008.

Thus, it has been discovered that the integrated circuit packaging system 100 and the moldable underfill 210 furnish important and heretofore unknown and unavailable solutions, capabilities, and functional aspects for manufacturing integrated circuit packages in an efficient, low-cost manner.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   attaching a flip chip having a top chip surface to the substrate;
   applying a thermal interface material to the top chip surface, the thermal interface material fully covering the top chip surface;
   attaching a heat slug to the substrate and the thermal interface material; and
   forming a moldable underfill having a top underfill surface on the substrate, the flip chip, and the heat slug, the moldable underfill having a characteristic of being liquid at room temperature and the top underfill surface over the flip chip.

2. The method as claimed in claim 1 further comprising forming an external interconnect on the bottom surface of the substrate.

3. The method as claimed in claim 1 wherein attaching the flip chip includes attaching with an internal interconnect the flip chip to the substrate.

4. The method as claimed in claim 1 wherein forming the moldable underfill includes forming the moldable underfill exposing the heat slug.

5. The method as claimed in claim 1 wherein forming the moldable underfill includes enclosing the flip chip in the moldable underfill.

* * * * *